United States Patent [19]

Sullivan

[11] 4,231,026
[45] Oct. 28, 1980

[54] BATTERY DISCHARGE LEVEL DETECTION CIRCUIT

[75] Inventor: James R. Sullivan, Nanuet, N.Y.
[73] Assignee: Power Conversion, Inc., Mount Vernon, N.Y.
[21] Appl. No.: 941,933
[22] Filed: Sep. 13, 1978
[51] Int. Cl.² .................................................. G08B 21/00
[52] U.S. Cl. ..................................... 340/636; 340/661; 320/48
[58] Field of Search ............... 340/636, 660, 661, 663, 340/664; 320/48

[56] References Cited
U.S. PATENT DOCUMENTS

| | | | |
|---|---|---|---|
| 4,017,724 | 4/1977 | Finger | 340/636 |
| 4,080,560 | 3/1978 | Albert | 340/636 |
| 4,139,846 | 2/1979 | Conforti | 340/636 |

Primary Examiner—Alvin H. Waring
Attorney, Agent, or Firm—Hopgood, Calimafde, Kalil, Blaustein & Lieberman

[57] ABSTRACT

A circuit for detecting the discharge level of a long life battery, such as a lithium battery, in which the battery is periodically subjected to an increased load for short durations of time. The periodic increases in load allows the end of battery life to be predicted and detected prior to the time the battery is fully depleted. Forecasting the end of battery life ensures that the battery will have sufficient energy to reliably operate the discharge level detection circuitry before the battery is fully depleted.

5 Claims, 4 Drawing Figures

BATTERY DISCHARGE LEVEL DETECTION CIRCUIT

FIELD OF THE INVENTION

This invention relates to detection circuitry and, more particularly, to a circuit for detecting the discharge level of a long life battery, such as lithium battery.

DESCRIPTION OF THE PRIOR ART

Various types of alarm circuits are currently in use in commercial and home environments. Such alarm circuits are typically used to detect smoke and/or excess heat, to detect the presence of intruders, or to detect other emergency conditions which necessitate the sounding of an alarm to alert the proper parties of an emergency condition. The majority of the alarm circuits in use require a battery to provide power for the circuit due to the fact that the operation of the circuit cannot depend on the availability of the commercial power supply. In addition, a battery utilized in such alarm circuits should be of extremely long life so that the battery does not have to be repeatedly changed in order to ensure the continuous operation of the alarm circuit. A common type of battery used in such applications is a lithium battery which has a relatively low voltage output, but has an extremely long life, thereby making this battery ideal for alarm applications.

When utilizing a battery in an alarm circuit it is, of course, absolutely necessary that the battery output be continously monitored, and that an alarm be sounded when the battery output drops below a predetermined voltage level. Such a monitoring function is relatively easy to provide and various types of monitoring circuits are well known in the art. With lithium batteries, however, the monitoring function is not easy to provide due to the fact that, with lithium batteries, it has been found that towards the end of battery discharge a rather sharp fall-off in output voltage occurs. This sharp voltage drop, near the end of battery life, occurs at different times depending on the battery load, with a greater load resulting in an earlier output voltage drop. A known type of lithium battery is the lithium 1AH cell which when subjected to a load of 10 microamps maintains a flat voltage profile for approximately 95% of the battery life before an output voltage drop occurs. In contrast, this same battery, when subjected to a load of 150 milliamps will reach the sharp output voltage fall-off point after 70% of battery life.

This characteristic of lithium batteries renders the monitoring of the discharge level extremely difficult in that when attempting to predict the complete discharge of the battery, it has been found that by the time the monitoring circuitry senses that the battery output is beginning to drop there is already insufficient energy remaining in the battery to reliably operate the monitoring circuitry. This, of course, is an undesirable condition for alarm circuits in that battery failure, and thus the failure of the alarm circuit, will not be detected resulting in the absence of the protection provided by the alarm circuit.

It is therefore an object of this invention to provide apparatus which can forecast the occurrence of battery discharge at some time prior to the point at which the battery is completely discharged.

It is a further object of this invention to provide apparatus for reliably detecting a low energy state of a long life battery such as a lithium battery.

It is a further object of this invention to provide low cost and reliable circuitry for detecting the discharge level of a long life battery.

It is a further and general object of this invention to provide reliable detection circuitry for determining the discharge point of a long life battery without materially increasing the load to which the battery is subjected.

SUMMARY OF THE INVENTION

In accordance with the invention a long life battery, such as a lithium battery, is normally subjected to a predetermined load which results in a slow discharge rate for the battery.

It is a feature of the invention that the battery load is periodically increased to a level which is greater than the normal load to which the battery is subjected.

It is a further feature of the invention that apparatus is provided for detecting a decrease in battery output voltage resulting from the periodic increase in battery load.

It is a still further feature of the invention that the detection apparatus is capable of forecasting the end of battery life due to the periodic increase in battery load, and that an alarm is sounded to indicate a low level energy condition.

The foregoing and other objects and features of this invention will be more fully understood from the following description of an illustrative embodiment thereof taken in conjunction with the accompanying drawings.

DETAILED DESCRIPTION

Figure 4:
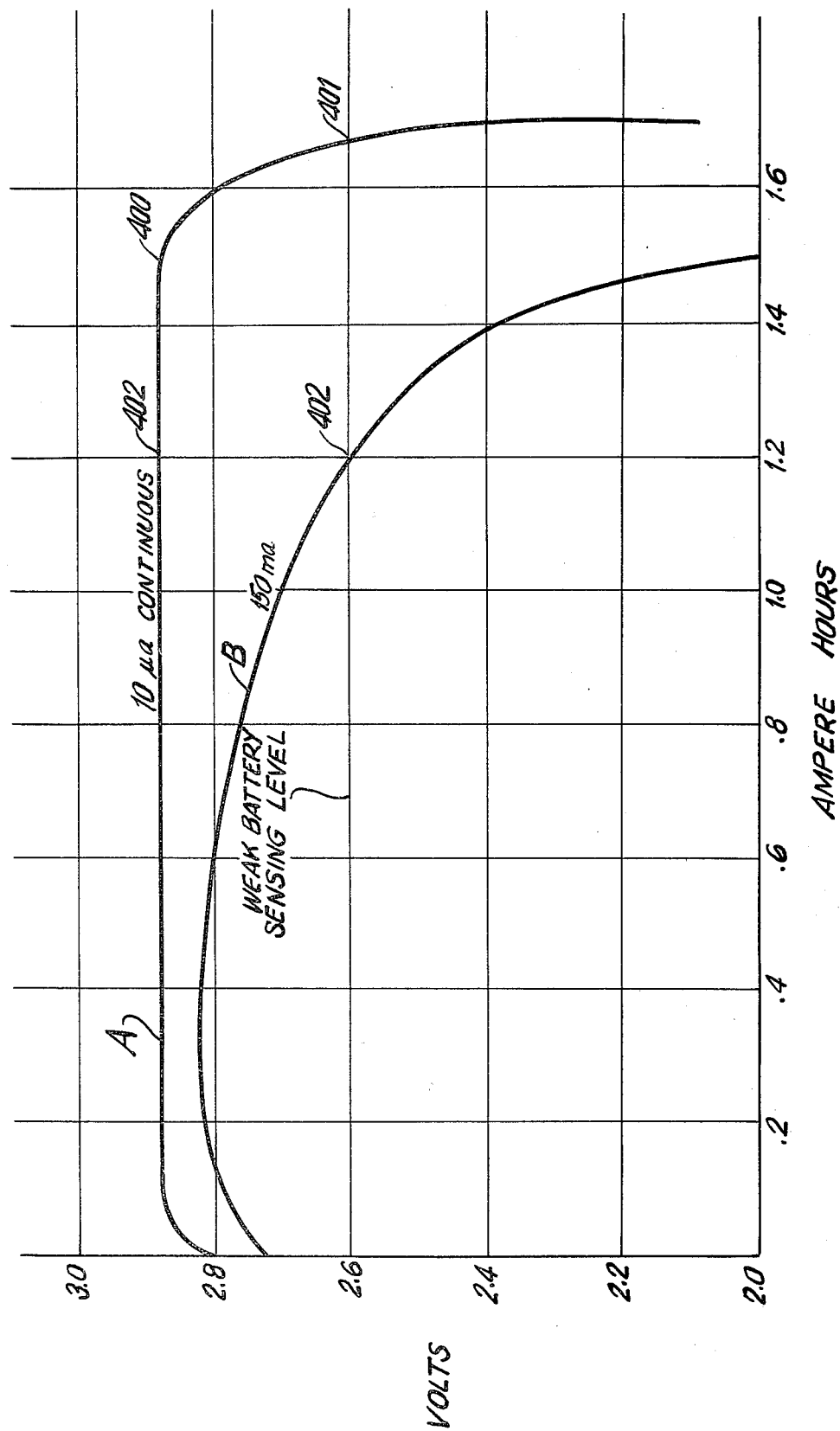
FIG. 4 illustrates the voltage output for a long life battery, such as a lithium battery, under conditions of light load and increased load.

Prior to commencing a description of the circuitry of the instant invention it is advantageous to refer to FIG. 4, which illustrates the output voltage for a long life battery, such as a lithium battery, under two conditions of battery loading. More particularly, a typical lithium battery has an output voltage of approximately 2.8 volts illustrated by curve A in FIG. 4. The output voltage of the battery is relatively stable for a period in excess of 1.4 ampere hours. Shortly thereafter, the battery output voltage begins to sharply drop as indicated at 400 in FIG. 4. Also indicated in FIG. 4 is a weak battery sensing level established at 2.6 volts. This level is somewhat arbitrary but is indicative of the level at which it is desirable to indicate that the battery life is coming to an end.

Curve A in FIG. 4 illustrates battery output voltage for a 10 microamp load on the battery. With such a load the battery output voltage goes from the plateau level of 2.8 volts to the weak battery level of 2.6 volts in a relatively short time. Subsequent to the output voltage reaching the weak battery level, the output voltage drops off sharply as indicated at 401. This sharp drop-off makes it exteremely undesirable to detect a weak battery level at 401 in that the battery, at this point, probably has insufficient energy to reliably operate the detection circuitry.

Curve B in FIG. 4 illustrates battery output voltage for a battery load of 150 milliamps. As illustrated with curve B the battery output falls off at a greater rate than with a 10 microamp load but the decrease in battery output voltage is gradual and does not sharply decrease subsequent to the weak battery sensing level. The fact that the battery output voltage continues to gradually decrease subsequent to point 402 illustrates that with a high load, such as 150 milliamps, the battery, subsequent to the weak battery level, should have sufficient remaining energy to reliably operate the detection circuitry.

Figure 1:
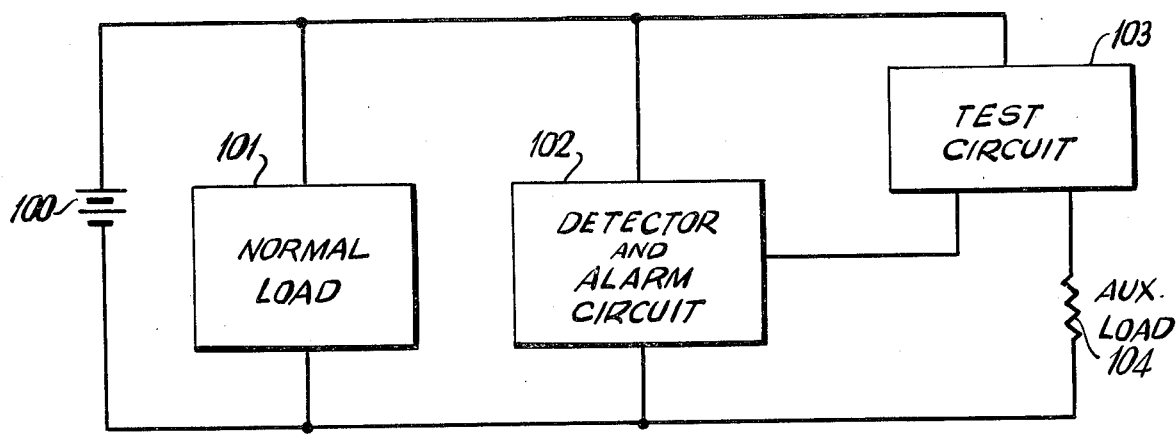
FIG. 1 illustrates a block diagram representation of a battery discharge level detection circuit in accordance with the instant invention.

Refer to FIG. 1 wherein is illustrated a circuit for reliably detecting the discharge level of a long life battery, such as a lithium battery. Battery 100 is advantageously a lithium battery, and has the output voltage curves explained above in conjunction with FIG. 4. The battery is normally subjected to a low level load illustrated by block 101. This load can be of any type and preferably is an alarm circuit. In accordance with the discussion given above for FIG. 4, it is anticipated that the normal load condition for battery 100 will be approximately 10 microamps. Connected in parallel with load 101 is detector and alarm circuit 102, test circuit 103 and auxillary load 104. Test circuit 103 is designed to subject battery 100 to a periodic increase in load current. Each time battery 100 is subjected to an increased load, detector and alarm circuit 102 is enabled and functions to detect a decrease in battery output voltage. For purposes of the discussion hereinafter it is assumed that test circuit 103 subjects battery 100 to a load of 150 milliamps for a period of 25 microseconds and that this increased load occurs at 1 minute intervals.

Referring to FIG. 4 it can be seen that each time battery 100 is subjected to the increased load, by test circuit 103, the battery will discharge in accordance with curve B in FIG. 4. At all other times (when the battery is being subjected to a normal load) the battery will discharge in accordance with curve A in FIG. 4. By subjecting battery 100 to periodic increases in load, for very short intervals of time, the voltage profile of the battery will alternate between curves A and B. Therefore, the output voltage of the battery will follow curve A when the battery is subjected to normal load 101 and the output voltage of the battery will follow curve B when test circuit 103 is operated. This periodic increase in load provides a means by which the occurrence of the sharp fall-off point of the output voltage can be effectively forecasted. More particularly, it can be seen that when the output voltage of battery 100 reaches point 402 on curves A and B the operation of test circuit 103 will pull the output voltage of battery 100 below the weak battery sensing level. At this point an alarm will be activated which will indicate to the proper personnel that the battery has reached a low level state and that it is time to replace the battery. Detecting the weak battery level at point 402, rather than at point 401, ensures that the battery will have sufficient energy to reliably operate the detection circuitry.

Figure 2:
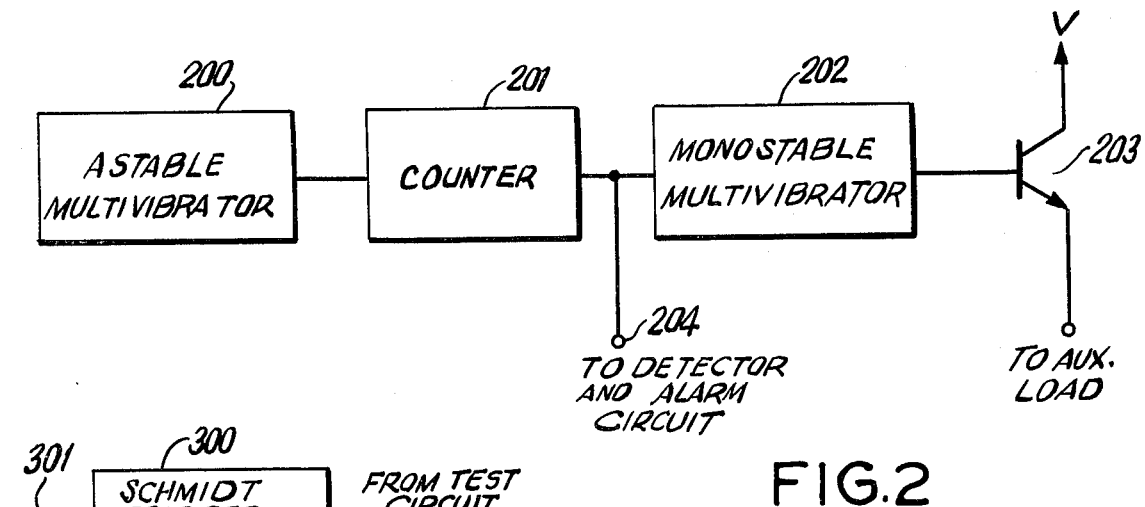
FIG. 2 illustrates a block diagram representation of the test circuit utilized in the battery discharge level detection circuit of FIG. 1.

Refer now to FIG. 2 which is a block diagram representation of test circuit 103. Astable multivibrator 200 is designed to produce a pulse train at a predetermined high frequency. This high frequency pulse train is counted down by counter 201 and counter 201 is arranged to produce an output pulse at one minute intervals. The output of counter 201 is applied to monostable multivibrator 202 and is also applied to detector and alarm circuit 102 via terminal 204. Each time counter 201 produces an output pulse monostable multivibrator 202 is enabled and produces a 25 microsecond pulse. The 25 microsecond pluse is applied to transistor 203 which turns the transistor ON. In response thereto battery voltage "V" is applied to auxillary load 104 via transistor 203. Auxillary load 204 is schematically illustrated as a simple resistive load and is designed to draw 150 milliamps of current each time transistor 203 is turned on. Therefore, it can be seen that test circuit 103 periodically subjects battery 100 to a load of 150 milliamps by having counter 201 produce a pulse every one minute with each pulse in turn causing multivibrator 202 to produce a 25 microsecond pulse to thereby enable transistor 203. The level of the periodic load is determined by resistor 104 and advantageously is designed to be approximately 150 milliamps.

Figure 3:
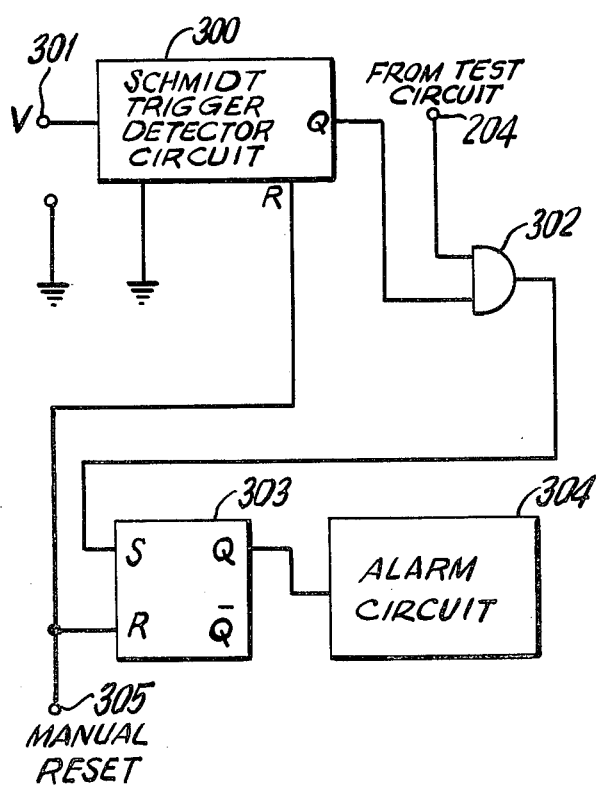
FIG. 3 illustrates a block diagram representation of a circuit for detecting a reduced battery voltage level in accordance with the instant invention.

Refer now to FIG. 3 which is a block diagram representation of one embodiment of a detector and alarm circuit. The detector and alarm circuit includes a standard Schmidt trigger circuit which can be manually reset to a predetermined state. Schmidt trigger circuits are well known in the art and are described at page 389 of "Pulse, Digital and Switching Waveforms" by Millman and Taub, McGraw-Hill Book Co., 1965. As described in this reference, Schmidt triggers have the ability to detect a change in voltage level. More particularly, the Q output of Schmidt trigger circuit 300 is maintained at a logical "0" level when the voltage applied to terminal 301 is maintained between predetermined upper and lower voltage levels. When the voltage applied to terminal 301 drops below the lower predetermined level the Q output of circuit 300 will change from a logical "0" state to a logical "1" state and will remain in that state until voltage V is increased to a level above that of the upper predetermined level or until circuit 300 is manually reset with the application of a voltage pulse to terminal 305.

As described above, the output voltage of battery 100, applied between terminals 301 and circuit ground, will normally range between 2.6 volts and 2.8 volts. While the battery voltage is in this range the output of circuit 300 is at a logical "0" level and gate 302 is disabled. Periodically, test circuit 103 applies an increased load to the battery in accordance with the previous discussion and each time an increased load is applied to the battery a pulse is applied from terminal 204 to gate 302. If, in response to the high load applied to the battery, the battery voltage drops below 2.6 volts, Schmidt trigger circuit 300 will be enabled causing the Q output to go to a logical "1" level. At the same time a pulse from counter 201 will be applied to gate 302 via terminal 204. The combination of the Q output of circuit 300 being at a logical "1" and the enabling pulse from counter 201 causes the output of gate 302 to go high thereby setting flip-flop 303. In response thereto, the Q output of flip-flop 303 goes high and enables alarm circuit 304. The alarm circuit can be of any standard type and functions to activate a siren, light or other indicators to alert the user of the device that the battery voltage has reached the weak battery level. Subsequent to the activation of the alarm it is anticipated that the operator will operate the manual reset via a switch applied to terminal 305. This switch will apply a reset pulse to flip-flop 303 thereby resetting the flip-flop and will also apply a reset pulse to Schmidt trigger 300 thereby causing the Q output of the Schmidt trigger to return to a logical "0". This action restores the circuit to its pre-alarm state. Subsequent thereto, the operator can replace the battery in the circuit and the circuit will resume normal operation.

Alternatively, the circuitry described above for detecting the weak battery sensing level could be replaced with circuitry designed to detect the difference between the battery voltage under normal load and the battery voltage under increased load. When this difference exceeds a predetermined amount the alarm would be activated in accordance with the previous discussion. The exact detection method utilized is arbitrary but it is desirable to utilize a detection method which uses minimum circuitry and minimum power. One such detection method, which could be adapted for use with the instant invention is described in EEE at Page 24, dated August 1962 and entitled "Differential Voltage Comparator."

In summary, therefore, the battery life of a long life battery, such as a lithium battery, is detected by periodically applying a high level load in excess of the normal load, to the battery. The high level load, periodically applied to the battery, results in the output voltage of the battery decreasing at an increased rate such that a predetermined weak battery level is reached earlier than normal. The application of the periodic load allows the end of battery life to be forecasted prior to the actual end of battery life thereby ensuring that sufficient energy remains in the battery at the weak battery level to reliably operate the detection circuitry. Responsive to the periodic application of an increased load to the battery is a detection circuit which detects a decrease in the battery voltage below the weak battery level. The occurrence of the weak battery level being reached activates an alarm circuit which indicates to the operator that the battery voltage has fallen below the danger level. It is to be understood that the circuitry described above for accomplishing the periodic application of an increased load to the battery and for the detection of the low battery level are simply exemplary circuits and other standard circuits could be utilized to accomplish the functions described above.

Although a specific embodiment of this invention has been shown and described it will be understood that various modifications may be made without departing from the spirit of this invention.

I claim:

1. A circuit for detecting the energy level of a long life battery, such as lithium battery, comprising:
   means for normally loading the battery at a predetermined current level,
   means for periodically increasing the battery load to a current level higher than said predetermined current level,
   means responsive to said increasing means for detecting a decrease in battery voltage output resulting from the increase in battery load, and
   means responsive to said detecting means for establishing an alarm condition at the time said decreased battery voltage is detected, said increasing means including means for generating a pulse train of a predetermined frequency, means for counting down the pulse train, means responsive to the counting means for generating an enabling pulse, and means responsive to said enabling pulse for increasing the battery load.

2. A circuit for detecting the energy level of a battery in accordance with claim 1, wherein said detecting means includes means for generating a voltage pulse in response to said decrease in battery voltage, means responsive to said voltage pulse and to the increasing means for setting a flip-flop, and means responsive to the setting of the flip-flop for establishing an alarm condition.

3. A circuit for detecting the energy level of a battery in accordance with claim 2, further including means for applying a reset pulse to said flip-flop and to said detection means.

4. A circuit for detecting the energy level of a battery in accordance with claim 3, wherein the ratio between the increased current level and the predetermined current level is approximately 10 to 1.

5. A circuit for detecting the energy level of a long life battery, such as a lithium battery, comprising:
   means for normally loading the battery at a predetermined current level,
   means for periodically increasing the load, for a predetermined interval of time, to a current level higher than said predetermined current level, said periodic increases occurring at intervals of approximately one minute, said predetermined interval of time being preferably no more than 25 microseconds and a ratio between said higher current level and said predetermined current level being approximately 10 to 1,
   means responsive to said increasing means for detecting a decrease in battery voltage output resulting from the increase in battery load, and
   means responsive to said detecting means for establishing an alarm condition at the time said decreased battery voltage is detected.

* * * * *